(12) United States Patent
Hsu et al.

(10) Patent No.: US 6,838,381 B2
(45) Date of Patent: Jan. 4, 2005

(54) METHODS FOR IMPROVING SHEET RESISTANCE OF SILICIDE LAYER AFTER REMOVAL OF ETCH STOP LAYER

(75) Inventors: Peng-Fu Hsu, Hsinchu (TW); Ming-Huan Tsai, Hsinchu (TW); Baw-Ching Perng, Hsinchu (TW); Ju-Wang Hsu, Taipei (TW); Yaun-Hung Chiu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 154 days.

(21) Appl. No.: 10/329,598

(22) Filed: Dec. 26, 2002

(65) Prior Publication Data

US 2004/0127026 A1 Jul. 1, 2004

(51) Int. Cl.[7] .............................................. H01L 21/44
(52) U.S. Cl. ..................................................... 438/682
(58) Field of Search ................................. 438/630, 655, 438/664, 682

(56) References Cited

U.S. PATENT DOCUMENTS 6,265,271 B1 * 7/2001 Thei et al. ................... 438/296

OTHER PUBLICATIONS

Miessler, G. L., et al. *Inorganic Chemistry*, Prentice Hall, New Jersey (1991) pp. 430–432.
Chen, J., et al. *Comparison of TiSi$_2$, CoSi$_2$, and NiSi for Thin–Film Silicon–on–Insulator Applications*, J. Electrochem. Soc., vol. 144, No. 7, (Jul. 1997) pp. 2437–2442.
Totir, G.G., et al. *X–Ray Photoelectron Spectroscopy and Morphological Studies of Polycrystalline Nickel Surfaces Exposed to Anhydrous HF*, Journal of the Electrochemical Society, vol. 147, No. 11 (2000) pp. 4212–4216.
Gambino, J.P., et al. *Invited Review–Silicides and Ohmic Contacts*, Materials Chemistry and Physics, vol. 52 (1998) pp. 99–146.
Ohguro, T., et al. *Analysis of Resistance Behavior in Ti– and Ni–Salicided Polysilicon Films*, IEEE Transactions on Electron Devices, vol. 41, No. 12 (Dec. 1994) pp. 2305–2317.
Grunthaner, P.J., et al. *Oxygen Impurity effects at metal/ silicide interaces: Formation of silicon oxide and suboxides in the Ni/Si system*, J. Vac. Sci. Technol., vol. 19, No. 3 (Sep./Oct. 1981) pp. 641–648.
Howell, R.S., et al. *Preparation and stability of low temperature cobalt and nickel silicides on thin polysilicon films*, J. Vac. Sci. Technol. vol. A 18, No. 1 (Jan./Feb. 2000) pp. 87–93.

* cited by examiner

Primary Examiner—Richard Elms
Assistant Examiner—Beth E. Owens
(74) Attorney, Agent, or Firm—Slater & Matsil, L.L.P.

(57) ABSTRACT

A method of manufacturing a semiconductor device is provided. A nickel silicide layer (e.g., NiSi) is formed on a substrate. Next, a hydrogen plasma treatment may be performed on the silicide layer, which may induce the formation of metal/silicon hydride bonds in the silicide layer. An etch stop layer is formed over the silicide layer. A dielectric layer is formed over the etch stop layer. An opening is formed in the dielectric layer. A portion of the etch stop layer is etched away at the opening to expose at least a portion of the silicide layer therebeneath. The etch chemistry mixture used during the etching step preferably includes hydrogen gas. The change in sheet resistance for the exposed silicide layer portion at the opening after the etching step, as compared to before the etching step, is preferably not greater than about 0.10 ohms/square.

25 Claims, 3 Drawing Sheets

METHODS FOR IMPROVING SHEET RESISTANCE OF SILICIDE LAYER AFTER REMOVAL OF ETCH STOP LAYER

TECHNICAL FIELD

The present invention relates generally to methods for manufacturing semiconductor devices, and more particularly to methods for improving a resulting sheet resistance of a silicide layer after the removal of an etch stop layer.

BACKGROUND

It is known to use a silicide layer at a contact opening to improve the contact between a conducting material (e.g., copper, tungsten) filling the contact opening and the underlying substrate. Typically the contact opening opens to a source, drain, and gate region (i.e., a heavily doped silicon region) formed in the underlying substrate (CMOS). However, a contact opening may open to other regions or layers as well. There are many different processes and known ways to form a silicide layer and a contact opening. Also, there are wide varieties of materials that are typically used for the silicide layer. During the process of forming the contact opening, etching steps may lead to oxidation of the silicide layer. Such oxidation is usually undesirable because the oxidized portions often have a higher contact resistance. Also during such oxidation, silicon of the silicide layer may be consumed forming silicon dioxide, for example. Hence, there is a need for a way to reduce the amount of oxidation experienced by the silicide layer during the etching step(s) used to form the contact opening and/or used to remove an etch stop layer.

SUMMARY

The problems and needs outlined above are addressed by embodiments of the present invention. In accordance with one aspect of the present invention, a method of manufacturing a semiconductor device is provided. The method includes the following steps. First, a nickel silicide layer is formed on a substrate. Second, a hydrogen plasma treatment is performed on the silicide layer. Third, an etch stop layer is formed over the silicide layer. Fourth, a dielectric layer is formed over the etch stop layer. Fifth, an opening is formed in the dielectric layer. Sixth, a portion of the etch stop layer is etched away at the opening to expose at least a portion of the silicide layer therebeneath. A substantial portion of the suicide layer may have a NiSi composition before the etching step. Preferably, the change in sheet resistance for the exposed silicide layer portion at the opening after the etching step, as compared to before the etching step, is not greater than about 0.10 ohms/square. Also preferably, the sheet resistance for the silicide layer portion at the opening after the etching step is substantially unchanged. The hydrogen plasma treatment step may induce the formation of metal hydride bonds in the silicide layer. The etch chemistry mixture used during the etching step may include hydrogen gas.

In accordance with another aspect of the present invention, a method of manufacturing a semiconductor device is provided. This method may include the following steps. First, a nickel silicide layer is formed on a substrate. Second, an etch stop layer is formed over the silicide layer. Third, a dielectric layer is formed over the etch stop layer. Fourth, an opening is formed in the dielectric layer. Fifth, a portion of the etch stop layer is etched away at the opening to expose at least a portion of the silicide layer therebeneath using an etch chemistry mixture that includes hydrogen gas. A hydrogen plasma treatment may be performed on the silicide layer before the step of forming the etch stop layer.

In accordance with yet another aspect of the present invention, a method of manufacturing a semiconductor device is provided. This method includes the following steps. First, a nickel silicide layer is formed on a substrate. A substantial portion of the silicide layer has a NiSi composition. Second, an etch stop layer is formed over the silicide layer. Third, a dielectric layer is formed over the etch stop layer. Fourth, an opening is formed in the dielectric layer. Fifth, a portion of the etch stop layer is etched away at the opening to expose at least a portion of the silicide layer therebeneath, wherein the change in sheet resistance for the exposed silicide layer portion at the opening after the etching step, as compared to before the etching step, is not greater than about 0.10 ohms/square. Also, a hydrogen plasma treatment may be performed on the silicide layer before the step of forming the etch stop layer. Preferably, an etch chemistry mixture used for the etching step includes hydrogen gas.

The foregoing has outlined rather broadly the features of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION

For a more complete understanding of the present invention, and the advantages thereof, reference is now made to the following descriptions taken in conjunction with the accompanying drawings, in which.

DETAILED DESCRIPTION

The use of presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context of making semiconductor devices, namely processes for hindering an increase in sheet resistance across a silicide layer after removing an etch stop layer over the silicide layer at a contact opening.

Figure 1:
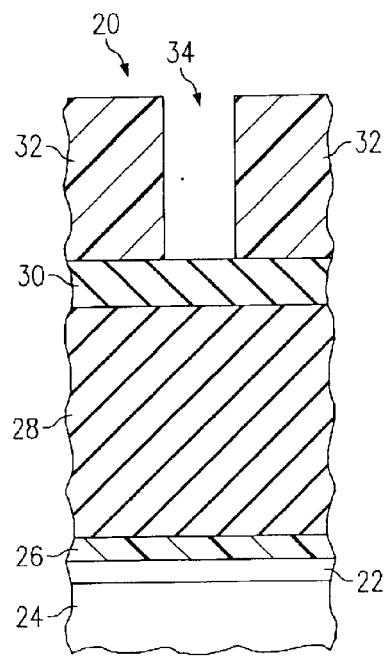
FIGS. 1–4 are sectional side views of a semiconductor device being formed.
Figure 2:
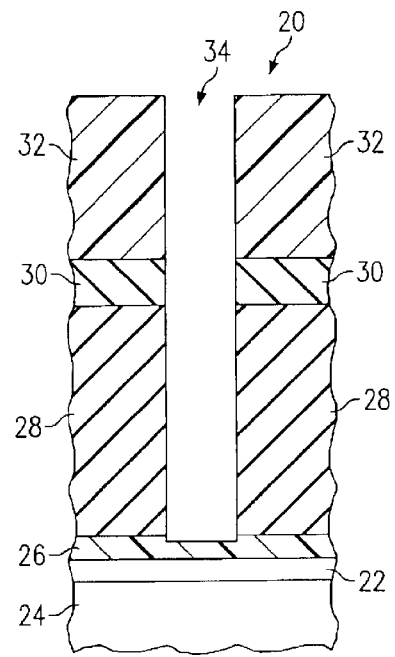
Figure 3:
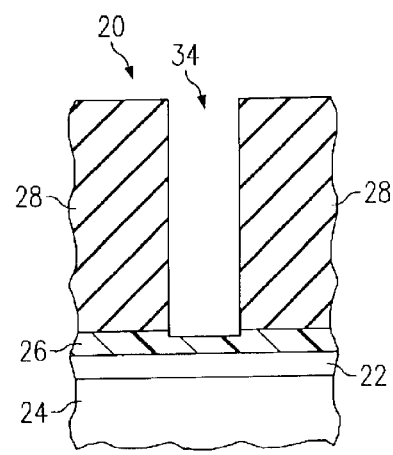
Figure 4:
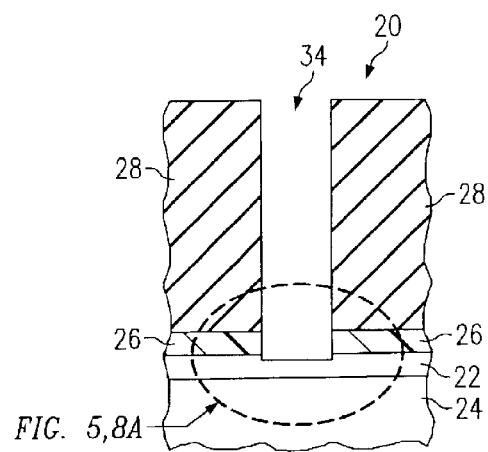

FIGS. 1–4 are sectional side views of a semiconductor device 20 being formed. In FIG. 1, a silicide layer 22 made from nickel silicide (NiSi), for example, is formed on a substrate 24. An etch stop layer 26 is formed over the silicide layer 22. A typical etch stop layer 26 composition may include, but is not necessarily limited to: silicon-oxynitride (SiON), silicon nitride (SiN), silicon carbide (SiC), other carbide mixtures, oxide mixtures, or any combination thereof, for example. A dielectric layer 28 (e.g., $SiO_2$) is formed on the etch stop layer 26. A bottom anti-reflective coating 30 is formed on the dielectric layer 28, and a photoresist layer 32 is formed on the bottom anti-reflective coating 30. An opening 34 (e.g., via or contact pattern) is formed in the photoresist layer 32. In FIG. 2, a contact etching step (e.g., using a conventional wet etching step) has been performed to further form the opening 34 down to the etch stop layer 26. In FIG. 3, the photoresist layer 32 and the bottom anti-reflective coating 30 have been removed. The next processing step between FIG. 3 and FIG. 4 is typically a dry etching step to remove the etch stop layer 26 from the bottom of the opening 34 to expose the silicide layer 22.

Nickel silicide materials will be used by some manufacturers in the next generation of semiconductor devices for the silicide layer 22 to provide less silicon consumption for the applications of ultra shallow junction and provide less line width dependence for smaller geometry, and keeping a compatible resistance as compared to past-used metal suicides. There are several nickel silicide materials being considered for use, including (but not necessarily limited to): NiSi, $Ni_2Si$, and $NiSi_2$. In comparing these three nickel suicides, NiSi is preferred over $Ni_2Si$ and $NiSi_2$ because NiSi provides a lower sheet resistance than $Ni_2Si$ and $NiSi_2$. However, NiSi is a thermodynamically unstable phase of this metal silicide. That is, NiSi is more easily oxidized and fluoridated during dry etching to form $SiO_2$ and $NiF_2$ (i.e., NiSi is more attracted by oxygen and free fluorine) than $NiSi_2$. Such conversion of NiSi to $SiO_2$ and/or $NiF_2$ consumes the silicon and/or nickel, which changes the resistance characteristics of the silicide layer 22. Thus, to use the more desirable NiSi material for the silicide layer 22, there is a need for an improved way to perform the dry etching step for removing the etch stop layer 26 (e.g., step between FIGS. 3 and 4) while decreasing oxidation and/or fluoridation of the NiSi material and while limiting the change in sheet resistance of the silicide layer 22. The processing methods of the preferred embodiments address these issues, as described below.

The NiSi layer may be formed by depositing nickel (and in some cases also a capped layer, e.g., Ti metal) directly on the silicon or polysilicon at a source, drain, and/or gate regions of the substrate 24 (i.e., after ion implantation steps for forming the heavily doped regions) and inducing the nickel to diffuse into the silicon. A high temperature environment of about 400–500° C. promotes the diffusion of the nickel into the silicon substrate 24. The timing, temperature, atmosphere and pressure of this metal diffusion process will affect the ratio of nickel to silicon in the resulting silicide layer 22. The excess nickel metal and capped layer, if any, is removed using a wet etch to leave the desired NiSi layer 22. A self-aligned silicide formation (i.e., salicide process) may be used to form the NiSi layer 22 on only the source and/or drain regions.

Figure 5:
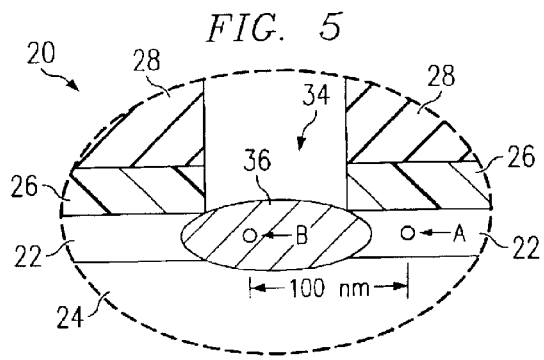
FIG. 5 is an enlarged view of a portion of FIG. 4.
Figure 6:
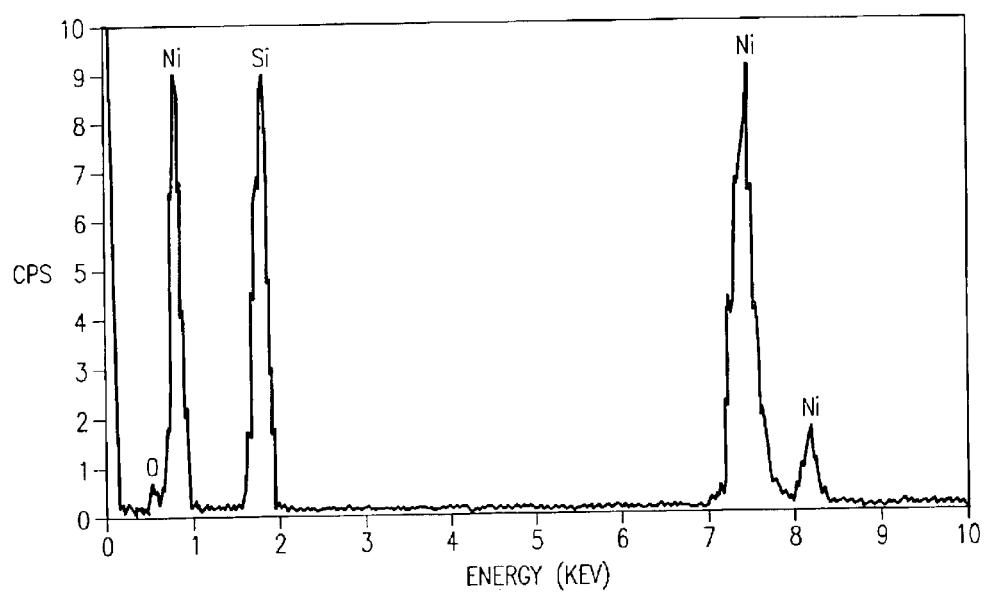
FIG. 6 is an energy-dispersive X-ray spectra plot of the silicide layer at spot A in FIG. 5.
Figure 7:
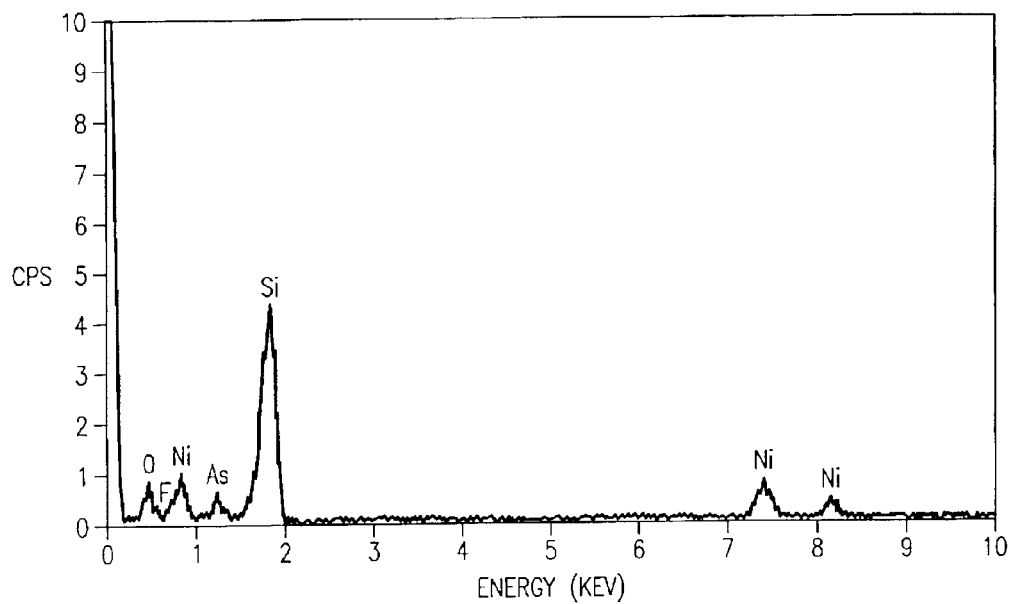
FIG. 7 is an energy-dispersive X-ray spectra plot of the silicide layer at spot B in FIG. 5.

FIGS. 5–7 are used next to illustrate the typical changes to a NiSi layer 22 when performing a dry etching step using a conventional oxygen-containing dry etch (e.g., etch chemistries including $O_2$ and/or CO) for removing the etch stop layer 26 at the contact opening 34. FIG. 5 is an enlarged sectional side view corresponding to the side view shown in FIG. 4, focusing on a silicided contact region 36 (i.e., the bottom of the contact opening 34 where the silicide layer 22 is exposed). Thus, if the processing step between FIGS. 3 and 4 is a conventional oxygen-containing dry etch (e.g., etch chemistries including $O_2$ and/or CO), the resulting silicided contact region 36 may be as shown in FIG. 5. FIG. 6 is an energy-dispersive X-ray spectra plot of the silicide layer 22 at spot A in FIG. 5. Spot A in FIG. 5 is a portion of the silicide layer 22 not exposed to the dry etching process, and thus not changed by the dry etching process. Note in FIG. 6 that the amount of nickel (about 9 counts per second (cps) at about 0.8 keV) and the amount of silicon (about 9 cps at about 1.8 keV) are in equal proportions, as desired to have the preferred NiSi properties.

Spot B in FIG. 5 is a portion at the silicided contact region 36 (i.e., at the contact opening 34) where the NiSi layer 22 has been oxidized by the dry etching process used to remove the etch stop layer 26 (i.e., between FIGS. 3 and 4). FIG. 7 is an energy-dispersive X-ray spectra plot of the silicide layer 22 at spot B in FIG. 5. As shown in FIG. 7, much of the nickel and silicon have been consumed by oxidation and fluoridation during the dry etching process. As shown in FIG. 7 for spot B, the amount of nickel at about 0.8 keV is only about 1 cps at spot B, as compared to about 9 cps at spot A (see FIG. 6). The amount of silicon in FIG. 7 for spot B at about 1.8 keV is only about 4.3 cps, as compared to about 9 cps at spot A (see FIG. 6). Also note that in FIG. 7 at about 7.3 keV, there is only about 0.9 cps at spot B, as compared to about 9 cps at spot A (see FIG. 6 at about 7.3 keV). Thus, the contact resistance at spot B is higher than at spot A where the NiSi remains unchanged.

Preferred embodiments of the present invention address the undesired conversion of a suicide layer 22 to materials with higher sheet resistance during the etch stop layer removal. In testing, the inventors found that the undesirable oxidation and/or fluoridation of an NiSi layer 22 may be reduced by a hydrogen ($H_2$) plasma treatment or an etch stop layer etching using hydrogen-containing etch chemistries, or a combination of the two, as will be next described.

In a first embodiment of the present invention, an $H_2$ plasma treatment is used to form metal hydride at and just beneath the surface of the NiSi layer 22. In the first embodiment, the $H_2$ plasma treatment is performed after the silicide layer 22 is formed on the substrate 24 (e.g., as described above) and before the etch stop layer 26 and subsequent layers (dielectric layer 28, anti-reflective coating 30, and photoresist 32) are deposited on the silicide layer 22.

Although it is difficult to determine the location of hydrogen in the crystal structure of NiSi, it is believed that the $H_2$ plasma treatment causes a top portion of either the NiSi layer 22 to form metal hydride bonds (e.g., Ni—H bonds) and/or silicon hydride bonds (e.g., silicon hydride layer through H ion flux induced Ni diffusion). The presence of metal/silicon hydride bonds at the top portion of the NiSi layer 22 will minimize the oxidation and fluoridation of the NiSi layer 22 during a subsequent dry etch to remove the etch stop layer 26. The $H_2$ plasma treatment process includes a step of pumping $H_2$ gas into a plasma chamber. Other gases may be used alternatively for the $H_2$ plasma treatment to induce metal hydride bond formations, including Ammonia gas ($NH_3$) or a mixture of $N_2$ and $H_2$ gas, where the nitrogen acts as a carrier gas for the hydrogen.

The inventors performed a first phase of testing to evaluate different conditions of using the first embodiment (i.e., $H_2$ plasma treatment to hinder oxidation) for a NiSi silicide layer 22. In testing different methods of reducing oxidation and fluoridation of the silicide layer 22, a measure that may be used to compare results is the change in or difference in sheet resistance for the silicide layer 22 after the dry etching step (etching to remove the etch stop layer 26 covering the silicide layer 22 at the contact opening 34) as compared to the silicide layer 22 before the $H_2$ plasma treatment and before the removal of the etch stop layer 26. The Rs tests were performed using blanket NiSi film within 300 Å thickness and without capping etch stop layer, and directly comparing the difference of sheet resistance (delta Rs) with pre- and post-dry etched NiSi. For example, looking at FIG. 5, the sheet resistance ($R_S$) across the silicide layer 22 at spot B may be compared to the sheet resistance ($R_S$) at spot A, which is representative of the original silicide layer composition before etching at spot B.

The following test data in Table 1 shows the test results from the first phase of testing for evaluating the first embodiment, with a focus on using $H_2$ plasma treatment under different conditions. The primary variables changed in these tests of Table 1 were pressure, source power, and bias power.

TABLE 1

| Test # | Rs (ohms/square) | | | Ave. Rs | Delta Rs | Testing conditions |
|---|---|---|---|---|---|---|
| $C_A$ | 4.80 | 4.81 | 4.79 | 4.80 | — | NiSi |
| 1 | 5.00 | 5.01 | 5.01 | 5.01 | 0.21 | $H_2$/50 mTorr/1000 W/100 W |
| 2 | 5.06 | 5.06 | 5.06 | 5.06 | 0.26 | $H_2$/50 mTorr/500 W/100 W |
| 3 | 5.03 | 5.03 | 5.03 | 5.03 | 0.23 | $H_2$/100 mTorr/1000 W/100 W |
| 4 | 5.06 | 5.06 | 5.05 | 5.06 | 0.26 | $H_2$/100 mTorr/500 W/100 W |
| 5 | 4.86 | 4.86 | 4.86 | 4.86 | 0.06 | $H_2$/50 mTorr/1000 W/0 W |
| 6 | 4.89 | 4.90 | 4.89 | 4.89 | 0.09 | $H_2$/50 mTorr/500 W/0 W |
| 7 | 5.18 | 5.18 | 5.19 | 5.18 | 0.38 | $H_2$/50 mTorr/500 W/100 W + $O_2$/50 mTorr/1500 W/100 W |
| 8 | 4.91 | 4.92 | 4.93 | 4.92 | 0.12 | $H_2$/50 mTorr/500 W/0 W + $O_2$/50 mTorr/1500 W/0 W |
| 9 | 4.91 | 4.91 | 4.92 | 4.91 | 0.11 | $H_2$/50 mTorr/1000 W/0 W + $O_2$/50 mTorr/1500 W/0 W |
| 10 | 4.96 | 4.95 | 4.94 | 4.95 | 0.15 | $O_2$/50 mTorr/1500 W/0 W |
| $C_B$ | 4.82 | 4.81 | 4.81 | 4.81 | — | NiSi |
| 11 | 4.98 | 4.98 | 4.99 | 4.98 | 0.17 | $O_2$/50 mTorr/1500 W/100 W |
| 12 | 5.02 | 5.01 | 5.02 | 5.02 | 0.21 | $H_2$/100 mTorr/500 W/0 W + $O_2$/50 mTorr/1500 W/0 W |
| 13 | 4.97 | 4.98 | 4.97 | 4.97 | 0.16 | $H_2$/100 mTorr/1000 W/0 W + $O_2$/50 mTorr/1500 W/0 W |
| 14 | 5.83 | 5.82 | 5.83 | 5.83 | 1.02 | CO/25 mTorr/500 W/300 W |

Referring to Table 1, test $C_A$ and $C_B$ were control tests to determine the average sheet resistance (Ave. $R_S$) of a NiSi layer 22 (i.e., pre-etching state), which will be used for comparisons for tests 1–10 and 11–14. The average sheet resistance (Ave. $R_S$) in test $C_A$ and $C_B$ were almost same: 4.79–4.82 ohms/square. In test 1, an $H_2$ plasma treatment was performed at a pressure of 50 mTorr, a source power of 1000 W, and a bias power of 100 W. The average sheet resistance in test 1 was 5.00 ohms/square, which is 0.21 ohms/square greater than the control resistance $C_A$ (4.80 ohms/square). In tests 2–6, $H_2$ plasma treatments were performed using different pressures, source powers, and bias powers, the results of which are shown in Table 1. Note that the best test results in Table 1 are tests 5 and 6, having sheet resistance changes (Delta $R_S$) of 0.06 ohms/square and 0.09 ohms/square, respectively. In tests 7–9, an $H_2$ plasma treatment and a dry etch using $O_2$ (was performed for each test using different testing parameters, to evaluate the performance of $H_2$ passivation process from oxidation resistance improvement point of view. Test 10 was performed without an $H_2$ plasma treatment and with an $O_2$ dry etch. The $O_2$ dry etch in test 10 was performed under the same dry etching conditions as in tests 7–9. Thus, tests 7–9 can be compared to test 10 to see the effects of using the $H_2$ plasma treatment when a dry etch using $O_2$-containing chemistries is performed to remove the etch stop layer 26 covering the NiSi layer 22 (see e.g., FIGS. 3 and 4).

In test 11, an $O_2$ dry etch without an $H_2$ plasma treatment was performed. Test 12 is the same as test 8, and test 13 is the same as test 9, except that the pressure for the $H_2$ plasma treatment was increased, and the increased pressure did not further decrease the change in sheet resistance (Delta $R_S$) (in comparison to test 9). In test 14 a CO dry etch without an $H_2$ plasma treatment was performed. Test 14 shows that CO dry etching causes much greater nickel consumption than $O_2$ dry etching. It should be noted also that the tests revealed to the inventors that an $O_2$ dry etch increases sheet resistance of the NiSi layer 22 more than a wet clean process (e.g., $H_2O_2$/$H_2SO_4$).

Therefore, based at least in part on the test results shown in Table 1, the inventors determined that $H_2$ plasma treatment passivation) of the first embodiment preferably should be performed under the following conditions: an $H_2$ flow rate of about 20–400 standard cubic centimeters per minute (sccm), a pressure of about 1 mTorr to about 1 Torr, a dual power source, a source power of about 250–2500 W, a bias power of about 0–500 W, and a treatment time of about 5 to 300 seconds. A preferred range of source power for $H_2$ plasma treatment of the first embodiment is about 500–1500 W. A preferred range of bias power for $H_2$ plasma treatment of the first embodiment is about 0–200 W. The conditions of test 5 in Table 1 provide a preferred set of conditions for the first embodiment calling for a pressure of about 50 mTorr, a source power of about 1000 W, and no bias power (0 W). In a preferred use of the first embodiment incorporating the $H_2$ plasma treatment, the following parameters may be used: dual power plasma source; source power of about 1000 W; bias power of about 150 W; a low pressure of about 25 mTorr; treatment time of about 30 seconds; and a temperature of about 50–60° C.

Although a high temperature $H_2$ reducing environment may be used in place of an $H_2$ plasma treatment in other embodiments to provide metal/silicon hydride bonds at the NiSi layer, $H_2$ plasma treatment is more preferable because a high temperature $H_2$ reducing environment process will have limited performance as it will only treat the top surface of the material. Whereas, a well controlled $H_2$ plasma treatment will penetrate to a suitable depth into the NiSi layer and without such high temperatures, which may cause other problems.

In a second embodiment of the present invention, hydrogen-containing etch chemistries are used to reduce undesirable oxidation and/or fluoridation of a silicide layer 22 (e.g., NiSi) while removing an etch stop layer 26. A typical etch stop removal process is show in FIGS. 3 and 4 (i.e., occurring between FIGS. 3 and 4), in which the second embodiment may be incorporated to improve the resulting silicide layer 22.

The inventors performed a second phase of testing to evaluate different conditions of using the second embodiment (i.e., hydrogen-containing etch chemistries to reduce oxidation). As in the first phase of testing (see Table 1), changes in or differences in sheet resistance (Delta $R_S$) for the blanket silicide layer 22 are again used to compare and evaluate the test results in the second phase of testing. Also, because NiSi is a preferred composition for the silicide layer 22, NiSi layers were evaluated in the second phase of testing as well.

The following test data in Table 2 shows the test results from the second phase of testing, with a focus on incorporating hydrogen gas into the etch chemistries for etching the etch stop layer 26 under different conditions. The primary variables changed in these tests of Table 2 were etch chemistry and bias power.

TABLE 2

| Test # | Rs (ohms/square) | | | Ave. Rs | Delta Rs | Testing conditions |
|---|---|---|---|---|---|---|
| $C_C$ | 4.72 | 4.72 | 4.73 | 4.72 | — | NiSi |
| 15 | 4.88 | 4.88 | 4.88 | 4.88 | 0.16 | $CH_2F_2/H_2/Ar +$ $O_2/50$ mTorr/1500 W/0 W |
| 16 | 4.87 | 4.87 | 4.86 | 4.87 | 0.15 | $CH_2F_2/Ar +$ $O_2/50$ mTorr/1500 W/0 W |
| 17 | 4.74 | 4.73 | 4.73 | 4.73 | 0.01 | $CF_4/H_2/Ar$/without bias power + $O_2/50$ mTorr/ 1500 W/0 W |
| 18 | 4.74 | 4.73 | 4.72 | 4.73 | 0.01 | $CF_4/Ar$/without bias power + $O_2/50$ mTorr/1500 W/0 W |
| $C_D$ | 4.66 | 4.65 | 4.65 | 4.65 | — | NiSi |
| 19 | 4.72 | 4.70 | 4.70 | 4.71 | 0.06 | $CF_4/H_2/Ar$/with bias power + $O_2/50$ mTorr/1500 W/0 W |
| 20 | 4.82 | 4.82 | 4.82 | 4.82 | 0.17 | $CF_4/Ar$/with bias power + $O_2/50$ mTorr/1500 W/0 W |
| $C_E$ | 4.74 | 4.73 | 4.73 | 4.73 | — | NiSi |
| 21 | 5.06 | 5.06 | 5.06 | 5.06 | 0.33 | $CH_2F_2/O_2/Ar +$ $O_2/50$ mTorr/1500 W/0 W |
| $C_F$ | 4.71 | 4.71 | 4.71 | 4.71 | — | NiSi |
| 22 | 5.74 | 5.74 | 5.74 | 5.74 | 1.03 | $CH_2F_2/O_2/CO/Ar +$ $O_2/50$ mTorr/1500 W/0 W |

Referring to Table 2, test $C_C$ was a control test to determine the average sheet resistance (Ave. $R_S$) of a NiSi layer 22, which will be used for comparisons for tests 15–18. The average sheet resistance (Ave. $R_S$) in test $C_C$ was 4.72 ohms/square. In test 15, an etch was performed on the etch stop layer 26 using an etch chemistry mixture including a combination of $CH_2F_2$, $H_2$, and Ar gases without bias power, then followed by an $O_2$ dry etch at a pressure of about 50 mTorr, a source power of about 1500 W, and no bias power (0 W). The average sheet resistance (Ave. $R_S$) in test 15 was 4.88 ohms/square, which is 0.16 ohms/square greater than the control resistance $C_C$ (4.72 ohms/square). However, in test 15, these testing conditions did not result in etching of the etch stop layer and rather only resulted in a polymer deposition. In tests 16–18, using different etch chemistry mixtures and without bias power, like test 15, the change in sheet resistance (Delta $R_S$) results were good (e.g., 0.01 ohms/square), but again these testing conditions did not result in etching of the etch stop layer, but rather only polymer deposition.

Control test $C_D$ was used as a reference point for tests 19 and 20. Because the sheet resistance changes (Delta $R_S$) in tests 17 and 18 were so favorable (0.01 ohms/square), these same etch chemistries were tested in tests 19 and 20, respectively, but with the use of bias power. The results of tests 19 and 20 were favorable because instead of just polymer deposition (as in tests 15–18), etching occurred at a rate of about 360 Å per minute. Note that the change in sheet resistance (Delta $R_S$) for test 19, where etching occurred, is only 0.06 ohms/square, which is very good. Thus, based on these test results shown in Table 2, it appears that some bias power is needed for the hydrogen-containing etch chemistry etching process to accelerate the gas particles sufficiently to cause etching, as opposed to just having polymer deposition.

Control tests $C_E$ and $C_F$ were each used as reference points for tests 21 and 22, respectively. In tests 21 and 22, other hydrogen-containing etch chemistries were tested with bias power: a mixture of $CH_2F_2$, $O_2$, and Ar gases; and a mixture of $CH_2F_2$, $O_2$, CO, and Ar gases. The etch rate for the chemistries tested in tests 21 and 22 was about 400–500 Å/min, which is faster than that of tests 19 and 20. However, the sheet resistance changes for tests 21 and 22 were significantly higher than those of test 19. Thus, the etch chemistry mixture in test 19 with bias power used provided the best (i.e., least) sheet resistance change (Delta $R_S$) for tests 19–22.

Therefore, corresponding to test 19, a preferred hydrogen-containing etch chemistry method for the second embodiment includes the use of the following mixing gas: a flow of about 5–30 sccm of fluorocarbon gas (e.g., $CF_4$), a flow of about 20–400 sccm of reductant gas (e.g., $H_2$), and a flow of about 50–500 sccm of diluting gas (e.g., inert gas, such as Ar). Other preferred conditions of the second embodiment include: a dual power source for the etching, a source power of about 500–1500 W, a bias power of about 50–500 W, and a pressure of about 1 mTorr to about 1 Torr. Based on the test results shown in Table 2, it appears that the conditions of test 19 provide one of the preferred uses of the second embodiment.

Figure 8A:
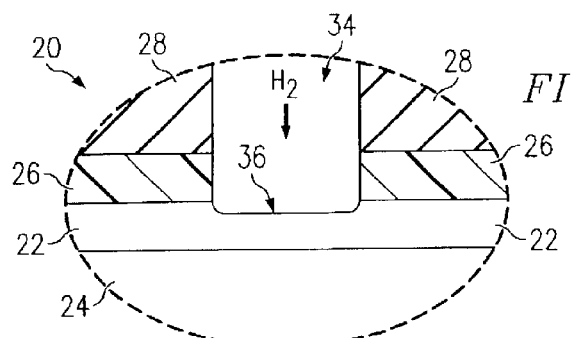
FIG. 8A is a sectional side view of a semiconductor device after the etch stop layer has been removed using the second embodiment of the present invention.
Figure 8B:
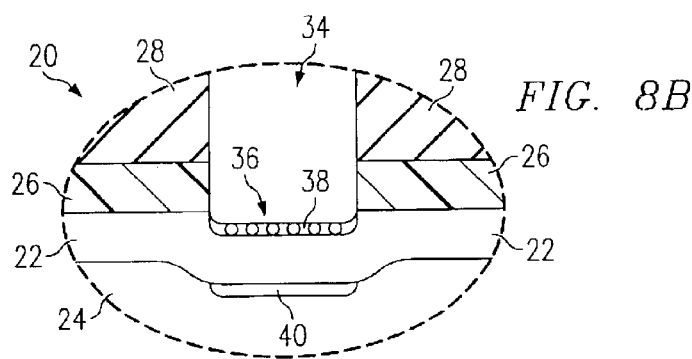
FIG. 8B is a sectional side view of the semiconductor device of FIG. 8A after being bombarded with etch chemistries used for removal of the etch stop layer.

A potential result that should be taken into account when using the second embodiment (hydrogen-containing etch chemistry) is the possibility that the nickel may be driven into the silicon substrate 24 by the hydrogen in the etch chemistry, which may provide an undesirable resulting structure. When hydrogen gas ($H_2$) is incorporated into the etch chemistry mixture, the hydrogen can induce or cause the nickel to penetrate deeper into the silicon, as shown in FIGS. 8A and 8B. In the example shown in FIGS. 8A and 8B, the etch chemistry mixture of test 19 in Table 2 was used. FIG. 8A shows an NiSi layer 22 on a polysilicon layer 24 (i.e., part of the substrate 24) after the etch stop layer 26 has been removed at the opening 34 using the second embodiment of the present invention. Note that FIG. 8A corresponds to an enlarged view of a portion of FIG. 4 (i.e., the same portion shown in FIG. 5 after different etching conditions). If the etch is carried out beyond the removal of the etch stop layer 26, i.e., if the etch chemistries bombard exposed portions of the NiSi layer 22 after the etch stop layer 26 is removed, then the hydrogen begins to drive the nickel deeper into the substrate 24. If the etch is carried out too long after the removal of the etch stop layer 26 (i.e., after the exposure of the NiSi layer 22 to the etch chemistries), the resulting structure may be as shown in FIG. 8B. In FIG. 8B, the top portion at the surface is now a silicon hydride layer 28 (mostly silicon because the hydrogen has driven the nickel deeper leaving silicon). Just below the silicon layer 28 is the desired NiSi layer 22 and a layer of $NiSiH_x$ 40. Hence, the hydrogen has penetrated through the NiSi layer 22 to form a $NiSiH_x$ layer 40, and has dragged some of the nickel along with it, which is what causes the nickel to be driven deeper. And, below the $NiSiH_x$ layer 40 is the polysilicon layer 24 (i.e., the substrate 24). If a structure such as that shown in FIG. 8B occurs, the top silicon layer 38 may be removed with another etch, such as an argon sputter. The structure shown in FIG. 8B is not preferred because the resulting Si top layer 38 will likely have a relatively large contact resistance if left there and because the addition of another step (e.g., argon sputter) to remove the top Si layer 38 is likely to be undesirable for process efficiency and integration. Furthermore, interface distortion between NiSi and Si substrates may negatively affect the reliability of the resulting device or circuit. It is thus preferable to avoid this situation where the nickel is driven into the substrate 24 by precisely controlling the etch time and etch conditions so that the etch is stop as soon as the etch stop layer 26 has been removed.

In other embodiments of the present invention, an H$_2$ plasma treatment may be combined with a hydrogen-containing etch chemistry to provide minimal sheet resistance change in the silicide layer 22 after removing the etch stop layer 26. However, such combination may not be preferred in some cases if it is not better for process integration. Hence, it will often be more desirable, from a process integration perspective, to perform either an H$_2$ plasma treatment (e.g., as in tests 5 and 6 of Table 1) or a hydrogen-containing chemistry etch (e.g., as in test 19 of Table 2). For some manufacturers, using a hydrogen-containing chemistry etch (as in test 19 of Table 2) may be preferred over an H$_2$ plasma treatment because the use of an H$_2$ plasma treatment process may be less favored and thus its use minimized.

The embodiments of the present invention may also be applicable to other materials used for forming a silicide layer, including but not limited to: palladium and silicon compounds (e.g., PdSi, Pd$_2$Si, PdSi$_2$), platinum and silicon compounds (e.g., PtSi, Pt$_2$Si, PtSi$_2$), cobolt and silicon compounds (e.g., CoSi$_2$), other nickel and silicon compounds (e.g., NiSi$_2$, Ni$_2$Si), or any combination thereof, for example.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the processes, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, comprising:
    forming a nickel silicide layer on a substrate;
    performing a reducing plasma treatment on the silicide layer;
    forming a dielectric layer over the silicide layer; and
    etching away a portion of the dielectric layer to form an opening and to expose at least a portion of the silicide layer therebeneath.

2. The method of claim 1, wherein the dielectric layer includes an etch stop layer.

3. The method of claim 1, wherein the reducing plasma treatment is a hydrogen plasma treatment.

4. A method of manufacturing a semiconductor device, comprising:
    forming a nickel silicide layer on a substrate;
    performing a hydrogen plasma treatment on the silicide layer;
    forming an etch stop layer over the silicide layer;
    forming a dielectric layer over the etch stop layer;
    forming an opening in the dielectric layer; and
    etching away a portion of the etch stop layer at the opening to expose at least a portion of the silicide layer therebeneath.

5. The method of claim 4, wherein a substantial portion of the silicide layer has a NiSi composition before the etching step.

6. The method of claim 5, wherein the change in sheet resistance for the exposed silicide layer portion at the opening after the etching step, as compared to before the etching step, is not greater than about 0.10 ohms/square.

7. The method of claim 4, wherein sheet resistance through the silicide layer at the opening is substantially unchanged after the etching step.

8. The method of claim 4, wherein the performing hydrogen plasma treatment step is performed under the conditions of:
    a flow of hydrogen being between about 20 standard cubic centimeters per minute (sccm) and about 400 sccm,
    a dual power source being used, wherein:
        a source power is between about 250 watts and about 2500 watts, and
        a bias power is between 0 and about 500 watts,
    a pressure being between about 1 mTorr and 1 Torr, and
    a treatment time being between about 5 seconds and about 300 seconds.

9. The method of claim 8, wherein the performing hydrogen plasma treatment step is performed under the conditions of:
    the source power being between about 500 watts and about 1000 watts, and
    the bias power being between 0 and about 200 watts.

10. The method of claim 8, wherein the performing hydrogen plasma treatment step is performed under the conditions of:
    the source power being about 1000 watts,
    the bias power being about 0 watts, and
    the pressure being about 50 mTorr.

11. The method of claim 8, wherein the performing hydrogen plasma treatment step is performed under the conditions of:
    the source power being about 1000 watts,
    the bias power being about 150 watts,
    the pressure being about 25 mTorr,
    the treatment time being about 30 seconds, and
    a temperature being between about 50° C. and about 60° C.

12. The method of claim 4, wherein the hydrogen plasma treatment step induces the formation of hydride bonds in the silicide layer, the hydride bonds being selected from a group consisting of metal hydride bonds and silicon hydride bonds.

13. The method of claim 4, wherein the etch chemistry mixture used during the etching step includes hydrogen gas.

14. A method of manufacturing a semiconductor device, comprising:
    forming a nickel silicide layer on a substrate;
    forming a dielectric layer over the silicide layer;
    forming an opening in the dielectric layer; and
    etching away a portion of the dielectric layer to form an opening in the dielectric layer and to expose at least a portion of the silicide layer therebeneath using an etch chemistry mixture that includes hydrogen gas during at least part of the etching.

15. A method of manufacturing a semiconductor device, comprising:

forming a nickel silicide layer on a substrate;

forming an etch stop layer over the silicide layer;

forming a dielectric layer over the etch stop layer;

forming an opening in the dielectric layer; and etching away a portion of the etch stop layer at the opening to expose at least a portion of the silicide layer therebeneath using an etch chemistry mixture that includes hydrogen gas.

16. The method of claim 15, wherein a substantial portion of the silicide layer has a NiSi composition before the etching step.

17. The method of claim 16, wherein the change in sheet resistance for the exposed silicide layer portion at the opening after the etching step, as compared to before the etching step, is not greater than about 0.10 ohms/square.

18. The method of claim 15, wherein sheet resistance through the silicide layer at the opening is substantially unchanged after the etching step.

19. The method of claim 15, wherein the etch chemistry mixture includes:

a flow of fluorocarbon gas being between about 5 sccm and about 30 sccm, a flow of reductant gas being between about 20 sccm and about 400 sccm, and a flow of inert gas being between about 50 sccm and about 500 sccm, and wherein the etching step is performed under the conditions of:

a dual power source being used, wherein:

a source power is between about 500 watts and about 1500 watts, and a bias power is between about 50 watts and about 500 watts, a pressure being between about 1 mTorr and 1 Torr, and an etch time being between about 0 seconds and about 200 seconds.

20. The method of claim 15, wherein the etch chemistry mixture includes:

a flow of a first gas selected from a first group consisting of $CF_4$, $CHF_3$, $CH_2F_2$, and $CH_3F$, a flow of a second gas selected from a second group consisting of $H_2$, $NH_3$, and $N_2$—$H_2$ mixture, and a flow of a third gas selected from a third group consisting of Ar, $N_2$, and He.

21. The method of claim 15, wherein the etch chemistry mixtures include:

a flow of $CF_4$ gas, a flow of $H_2$ gas, a flow of Ar gas, and wherein the etching step includes a dry $O_2$ etch performed under the conditions of:

a source power being about 1500 watts, no bias power, and a pressure being about 50 mTorr.

22. The method of claim 15, further comprising:

performing a hydrogen plasma treatment on the silicide layer before the step of forming the etch stop layer.

23. A method of manufacturing a semiconductor device, comprising:

forming a nickel silicide layer on a substrate, wherein a substantial portion of the silicide layer has a NiSi composition;

forming an etch stop layer over the silicide layer;

forming a dielectric layer over the etch stop layer;

forming an opening in the dielectric layer; and etching away a portion of the etch stop layer at the opening to expose at least a portion of the silicide layer therebeneath, wherein the change in sheet resistance for the exposed silicide layer portion at the opening after the etching step, as compared to before the etching step, is not greater than about 0.10 ohms/square.

24. The method of claim 23, further comprising:

performing a hydrogen plasma treatment on the silicide layer before the step of forming the etch stop layer.

25. The method of claim 23, wherein an etch chemistry mixture used for the etching step includes hydrogen-containing etching gas.

* * * * *